(12) United States Patent
Mercier et al.

(10) Patent No.: US 9,854,632 B2
(45) Date of Patent: Dec. 26, 2017

(54) OPTOELECTRONIC CIRCUIT WITH LOW-FLICKER LIGHT-EMITTING DIODES

(71) Applicant: Aledia, Grenoble (FR)

(72) Inventors: Frédéric Mercier, Saint Nicolas de Macherin (FR); Erwan Dornel, Fontaine (FR); Xavier Hugon, Teche (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 15/323,233

(22) PCT Filed: Jul. 8, 2015

(86) PCT No.: PCT/EP2015/065605
§ 371 (c)(1),
(2) Date: Dec. 30, 2016

(87) PCT Pub. No.: WO2016/005448
PCT Pub. Date: Jan. 14, 2016

(65) Prior Publication Data
US 2017/0223784 A1     Aug. 3, 2017

(30) Foreign Application Priority Data
Jul. 11, 2014  (FR) ..................................... 14 56708

(51) Int. Cl.
*H05B 33/08*     (2006.01)
*H01L 27/15*     (2006.01)
(Continued)

(52) U.S. Cl.
CPC ......... *H05B 33/083* (2013.01); *H01L 27/156* (2013.01); *H01L 33/483* (2013.01); *H01L 33/62* (2013.01); *H05B 33/0815* (2013.01)

(58) Field of Classification Search
None
See application file for complete search history.

(56) References Cited

U.S. PATENT DOCUMENTS 3,471,795 A * 10/1969 Schilling ................ H03F 3/211
                                                         330/299
3,641,490 A *  2/1972 Kawai ...................... B60Q 1/38
                                                         340/458
(Continued)

FOREIGN PATENT DOCUMENTS

EP        2 523 531 A1    11/2012
WO   WO 2012/085118 A1     6/2012

OTHER PUBLICATIONS

International Preliminary Report on Patentability for Application No. PCT/EP2015/065605 dated Jan. 17, 2017.
(Continued)

*Primary Examiner* — Crystal L Hammond
(74) *Attorney, Agent, or Firm* — Wolf, Greenfield & Sacks, P.C.

(57) ABSTRACT

An optoelectronic circuit for receiving a variable voltage having alternating increasing and decreasing phases. The optoelectronic circuit includes an alternating arrangement of resistive elements and light-emitting diode sets mounted in series. Each set contains two terminals. Each resistive element is inserted between two consecutive sets. The optoelectronic circuit includes, for each set among a plurality of said sets, a depletion mode metal oxide semiconductor field effect transistor, the drain and the source of which are coupled with the terminals of said set and the gate of which is coupled with one of the terminals of the next set. An additional resistive element is, for at least some of the transistors, coupled between the drain or the source of the transistor and one of the terminals of the set.

20 Claims, 4 Drawing Sheets

(51) Int. Cl.
   *H01L 33/48*    (2010.01)
   *H01L 33/62*    (2010.01)

(56) References Cited

U.S. PATENT DOCUMENTS

| | | | | |
|---|---|---|---|---|
| 4,256,977 | A * | 3/1981 | Hendrickson | H03K 17/687 |
| | | | | 323/351 |
| 7,800,316 | B2 * | 9/2010 | Haug | H05B 33/083 |
| | | | | 315/299 |
| 9,241,376 | B2 * | 1/2016 | Zhang | G09G 3/3406 |
| 2005/0127889 | A1 * | 6/2005 | Wada | G05F 3/30 |
| | | | | 323/315 |
| 2008/0088361 | A1 * | 4/2008 | Kimura | G05F 3/30 |
| | | | | 327/541 |
| 2011/0109244 | A1 * | 5/2011 | Grajcar | H05B 33/0827 |
| | | | | 315/294 |
| 2011/0199003 | A1 | 8/2011 | Muguruma et al. | |
| 2013/0187572 | A1 * | 7/2013 | Grajcar | H05B 33/0824 |
| | | | | 315/312 |
| 2014/0103823 | A1 * | 4/2014 | Kahlman | H05B 33/0815 |
| | | | | 315/186 |
| 2014/0210352 | A1 * | 7/2014 | Grajcar | H05B 33/0809 |
| | | | | 315/122 |

OTHER PUBLICATIONS

International Search Report for Application No. PCT/EP2015/065605, dated Aug. 21, 2015.

* cited by examiner

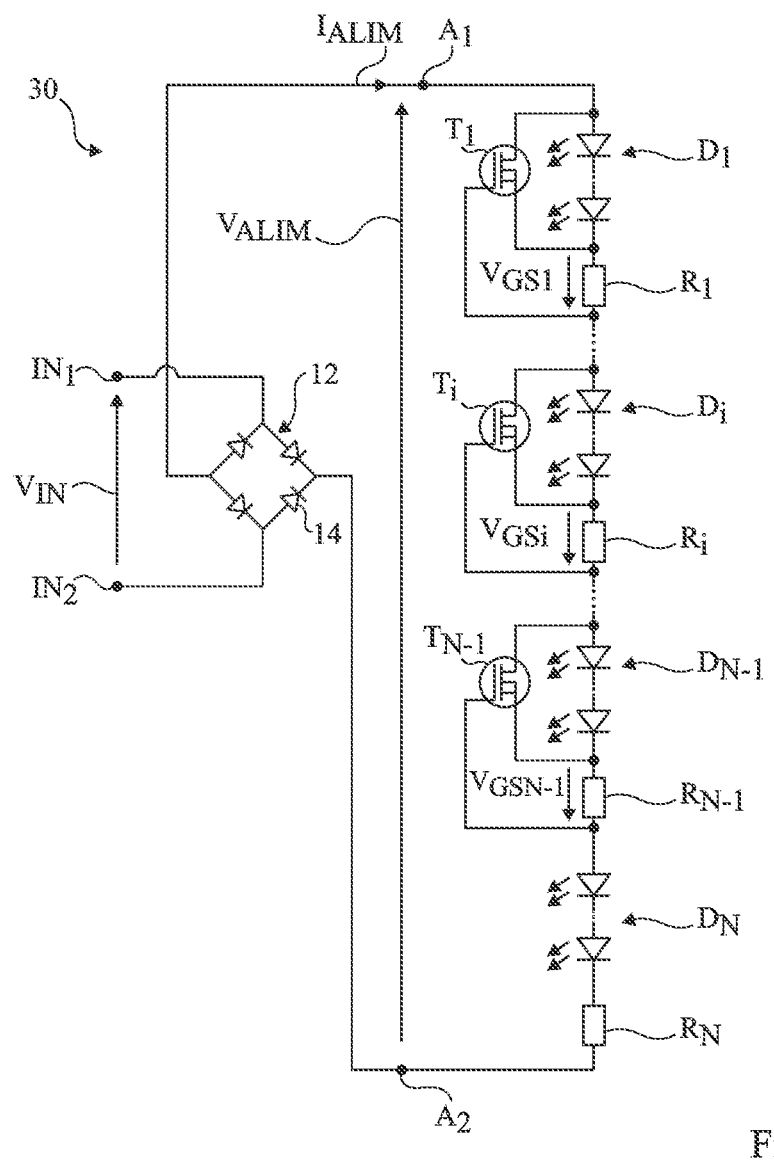
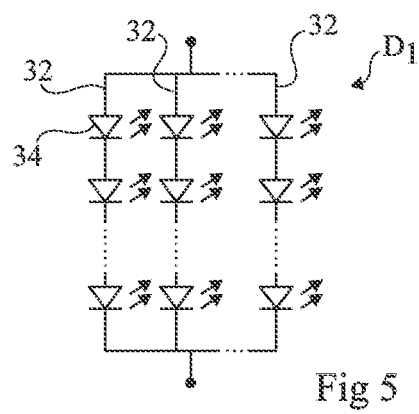
Fig 5
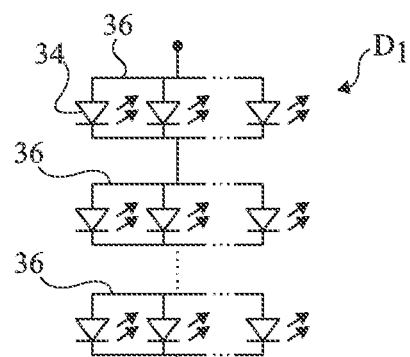
Fig 6
Fig 4

OPTOELECTRONIC CIRCUIT WITH LOW-FLICKER LIGHT-EMITTING DIODES

This application is the national phase of International Application No. PCT/EP2015/065605, filed on Jul. 8, 2015, which claims priority to French Application No. 14/56708, filed Jul. 11, 2014, which applications are incorporated herein by reference to the maximum extent allowable by law.

BACKGROUND

The present description relates to an optoelectronic circuit, particularly to an optoelectronic circuit comprising light-emitting diodes.

DISCUSSION OF THE RELATED ART

It is desirable to be able to power an optoelectronic circuit comprising light-emitting diodes with an AC voltage, particularly a sinusoidal voltage, for example, the mains voltage.

FIG. 1 shows an example of an optoelectronic circuit 10 comprising input terminals $IN_1$ and $IN_2$ having an AC voltage $V_{IN}$ applied therebetween. Optoelectronic circuit 10 further comprises a rectifying circuit 12 comprising a diode bridge 14, receiving voltage $V_{IN}$ and supplying a rectified voltage $V_{ALIM}$ between nodes $A_1$ and $A_2$, which powers light-emitting diodes 16, for example, series-assembled with a resistor 18. Call $I_{ALIM}$ the current flowing through light-emitting diodes 16.

FIG. 2 is a timing diagram of power supply voltage $V_{ALIM}$ and of power supply current $I_{ALIM}$ for an example where AC voltage $V_{IN}$ corresponds to a sinusoidal voltage. When voltage $V_{ALIM}$ is greater than the sum of the threshold voltages of light-emitting diodes 16, light-emitting diodes 16 become conductive. Power supply current $I_{ALIM}$ then follows power supply voltage $V_{ALIM}$. There thus is an alternation of phases OFF without light emission and of light-emission phases ON.

A disadvantage is that as long as voltage $V_{ALIM}$ is smaller than the sum of the threshold voltages of light-emitting diodes 16, no light is emitted by optoelectronic circuit 10. An observer may perceive this lack of light emission when the duration of each phase OFF with no light emission between two light-emission phases ON is too long. A possibility, to increase the duration of each phase ON, is to decrease the number of light-emitting diodes 16. A disadvantage then is that a significant amount of electric power is lost in resistor 18.

FIG. 3 shows another example of optoelectronic circuit 20. The elements common with optoelectronic circuit 10 are designated with the same reference numerals. The elementary light-emitting diodes are gathered in N sets of elementary light-emitting diodes, called general light-emitting diodes $D_i$ in the following description, N being an integer greater than or equal to 2. Optoelectronic circuit 20 comprises N−1 switches $SW_1$ to $SW_{N-1}$. Each switch $SW_i$ couples the cathode of light-emitting diode $D_i$ and node $A_2$. Each switch $SW_i$ is controlled by a control signal $S_i$ supplied by a control unit 22.

During a phase of increase of power supply voltage $V_{ALIM}$, switches $SW_1$ to $SW_{N-1}$ are successively turned off so that the number of light-emitting diodes receiving power supply voltage $V_{ALIM}$ progressively increases.

During a phase of decrease of power supply voltage $V_{ALIM}$, switches $SW_{N-1}$ to $SW_1$ are successively turned on so that the number of light-emitting diodes receiving power supply voltage $V_{ALIM}$ progressively decreases. This enables to decrease the duration of each phase with no light emission.

A disadvantage of optoelectronic circuit 20 is that control unit 22 should be capable of supplying the turn-off or turn-on signals of switches $SW_i$ at the right times according to the variation of power supply voltage $V_{ALIM}$. The structure of control unit 22 may be relatively complex.

Further, it may be desirable to form each switch $SW_i$ with a transistor, for example, a metal-oxide gate field effect transistor or MOS transistor, particularly to at least partly form optoelectronic circuit 20 with conventional integrated circuit manufacturing methods. Signal $S_i$ then corresponds to the voltage applied to the transistor gate. A disadvantage of optoelectronic circuit 20 is that the voltages applied to the terminals, particularly between the drain and the source, of at least some of transistors $SW_i$ are close to voltage $V_{ALIM}$ and may exceed 100 V. It is then necessary to use specific electronic components compatible with high voltages. Further, control unit 22 should generate different control signals for all transistors $SW_i$, which may increase the complexity of control unit 22.

SUMMARY

An object of an embodiment is to overcome all or part of the disadvantages of the previously-described optoelectronic circuits.

Another object of an embodiment is to decrease the duration of phases with no light emission of the optoelectronic circuit.

Another object of an embodiment is to decrease the bulk of the optoelectronic circuit.

Another object of an embodiment is to be able to totally form the optoelectronic circuit in integrated fashion.

An embodiment provides an optoelectronic circuit intended to receive a variable voltage containing an alternation of increase and decrease phases, the optoelectronic circuit comprising:

an alternation of resistive elements and of sets of series-assembled light-emitting diodes, each set comprising two terminals, each resistive element being interposed between two successive sets;

for each set from among a plurality of said sets, a depletion metal-oxide gate field effect transistor having its drain and its source coupled to the terminals of said set and having its gate coupled to one of the terminals of the next set.

According to an embodiment, the electronic circuit comprises N sets, where N is an integer in the range from 2 to 200, and comprising for each of the N−1 sets, a depletion metal-oxide gate field effect transistor having its drain and its source coupled to the terminals of said set and having its gate coupled to one of the terminals of the next set.

According to an embodiment, at least some of the resistive elements have different resistance values.

According to an embodiment, each resistive element comprises at least one electric resistor.

According to an embodiment, the electronic circuit further comprises, for at least some of the transistors, an additional resistive element coupled between the drain or the source of the transistor and one of the terminals of said set.

According to an embodiment, the electronic circuit further comprises a fullwave rectifying circuit capable of supplying said voltage.

According to an embodiment, the electronic circuit further comprises an integrated circuit comprising the sets of light-emitting diodes, the resistive elements, and the transistors.

According to an embodiment, each light-emitting diode is a planar diode.

According to an embodiment, the electronic circuit further comprises an integrated circuit comprising a support, the sets of light-emitting diodes resting on the support, each light-emitting diode comprising at least one wire-shaped, conical, or frustoconical semiconductor element.

According to an embodiment, the electronic circuit further comprises at least one insulating layer at least partially covering the support and, for each transistor, a semiconductor portion extending on the insulating layer and forming the source, the drain of the transistor, and the channel of the transistor, an insulating portion covering the semiconductor portion on the side opposite to the insulating layer and forming the gate insulator of the transistor.

According to an embodiment, the support comprises a non-doped or doped semiconductor substrate of a first conductivity type, the optoelectronic circuit comprising, for each transistor, doped semiconductor regions of a second conductivity type, more heavily doped than the substrate, extending into the substrate and forming the source, the drain, and the channel of the transistor and an insulating portion extending on the substrate and forming the gate insulator of the transistor.

BRIEF DESCRIPTION OF THE DRAWINGS

The foregoing and other features and advantages will be discussed in detail in the following non-limiting description of specific embodiments in connection with the accompanying drawings, among which:

FIG. 4 shows an electric diagram of an embodiment of an optoelectronic circuit comprising light-emitting diodes;

FIGS. 5 and 6 illustrate two layouts of the light-emitting diodes of the optoelectronic circuit of FIG. 4;

DETAILED DESCRIPTION

Figure 1:
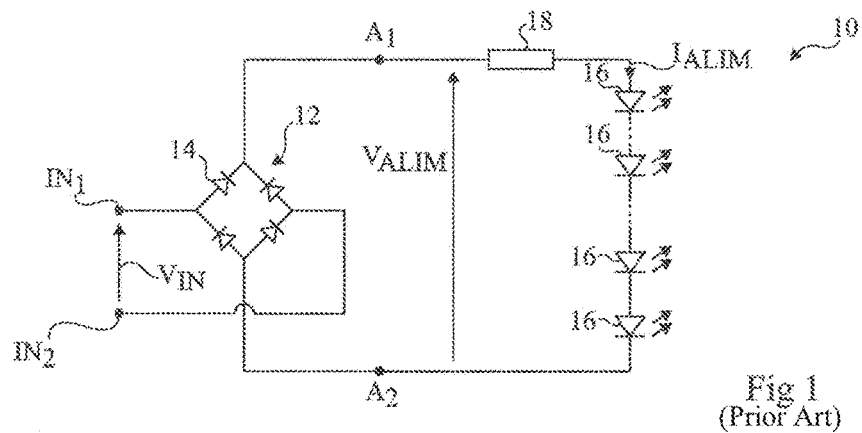
FIG. 1, previously described, is an electric diagram of an example of an optoelectronic circuit comprising light-emitting diodes.
Figure 2:
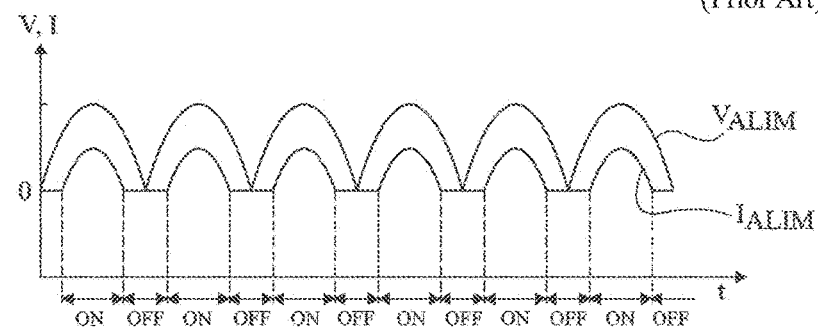
FIG. 2, previously described, is a timing diagram of the power supply voltage and current of the light-emitting diodes of the optoelectronic circuit of FIG. 1.

For clarity, the same elements have been designated with the same reference numerals in the various drawings and, further, the various drawings are not to scale. In the following description, unless otherwise indicated, terms "substantially", "approximately", and "in the order of" mean "to within 10%". Further, "compound mainly made of a material" or "compound based on a material" means that a compound comprises a proportion greater than or equal to 95% of said material, this proportion being preferably greater than 99%. Further, in the present description, term "connected" is used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

Figure 3:
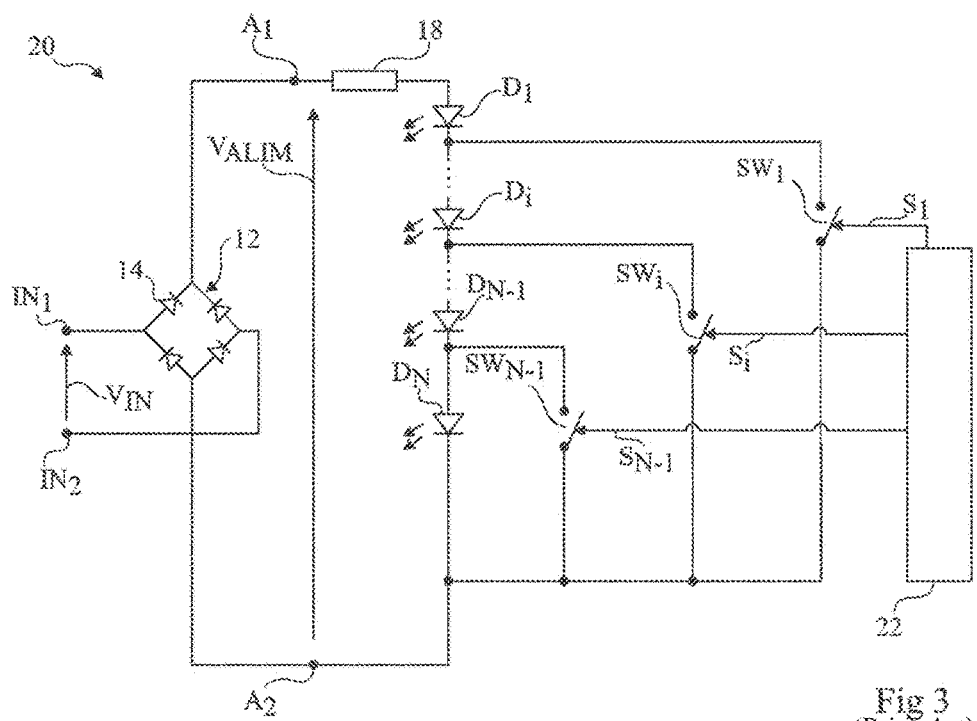
FIG. 3, previously described, is an electric diagram of another example of an optoelectronic circuit comprising light-emitting diodes.

FIG. 4 shows an electric diagram of an embodiment of an optoelectronic circuit 30. The elements common with optoelectronic circuit 20 shown in FIG. 3 are designated with the same reference numerals. As an example, input voltage $V_{IN}$ may be a sinusoidal voltage, particularly a sinusoidal voltage having a frequency in the range from 10 Hz to 1 MHz. Voltage $V_{IN}$ for example corresponds to the mains voltage. Number N of general light-emitting diodes is for example in the range from 2 to 200.

For i varying from 1 to N, optoelectronic circuit 30 comprises a resistor $R_i$ in series with light-emitting diode $D_i$. Resistances $R_i$ have different values. Each general light-emitting diode $D_1$ to $D_N$ comprises at least one elementary light-emitting diode and is preferably formed of the series and/or parallel connection of at least two elementary light-emitting diodes. In the present embodiment, for i varying from 1 to N−1, the cathode of general light-emitting diode $D_i$ is coupled to a terminal of resistor $R_i$ and the other terminal of resistor $R_i$ is coupled to the anode of light-emitting diode $D_{i+1}$. The anode of general light-emitting diode $D_1$ is coupled to node $A_1$. The cathode of light-emitting diode $D_N$ is coupled to a terminal of resistor $R_N$ and the other terminal of resistor $R_N$ is coupled to node $A_2$. General light-emitting diodes $D_i$, with i varying from 1 to N, may comprise the same number of elementary light-emitting diodes or different numbers of elementary light-emitting diodes.

For i varying from 1 to N−1, optoelectronic circuit 30 comprises a MOS transistor $T_i$ comprising first and second power terminals, that is, the drain and the source, and a control terminal, that is, the gate. The first power terminal of transistor $T_i$ is coupled to the anode of general light-emitting diode $D_i$ and the second power terminal of transistor $T_i$ is coupled to the cathode of general light-emitting diode $D_i$. The gate of transistor $T_i$ is coupled to the anode of light-emitting diode $D_{i+1}$. The bulk, or channel-forming region, of transistor $T_i$ is connected to the second power terminal of transistor $T_i$. In the following description, it is considered that the first power terminal of transistor $T_i$ corresponds to the drain and the second power terminal of transistor $T_i$ corresponds to the source. Call $V_{GSi}$ the voltage between the gate and the source of transistor $T_i$. Voltage $V_{GSi}$ corresponds to the voltage across resistor $R_i$.

Each transistor $T_i$ is a depletion MOS transistor. This MOS transistor is called normally-on, which means that it is in the on state when voltage $V_{GSi}$ is equal to 0 V. Transistor $T_i$ is in the off state when voltage $V_{GSi}$ is negative and smaller than a negative threshold voltage, for example in the order of −1 V. According to an embodiment, transistors $T_i$ are identical for i varying from 1 to N−1. In particular, the threshold voltages of transistors $T_i$ are identical. According to another embodiment, the transistors are different. In particular, the threshold voltages of transistors $T_i$ are different.

When transistor $T_i$ is in the on state, it short-circuits the associated general light-emitting diode $D_i$, which then does not conduct current $I_{ALIM}$. When transistor $T_i$ is in the off state, the associated general light-emitting diode $D_i$ conducts current $I_{ALIM}$.

FIG. 5 shows an embodiment of general light-emitting diode $D_1$ where general light-emitting diode $D_1$ comprises R branches 32 assembled in parallel, each branch comprising S elementary light-emitting diodes 34 series-assembled in the same conduction direction, R and S being integers greater than or equal to 1.

FIG. 6 shows another embodiment of general light-emitting diode $D_1$ where general light-emitting diode $D_1$ comprises P series-assembled blocks 36, each block comprising Q elementary light-emitting diodes 34 assembled in parallel, P and Q being integers greater than or equal to 1 and Q being likely to vary from one block to the other.

General light-emitting diodes $D_2$ to $D_N$ may have a structure similar to that of the general light-emitting diode $D_1$ shown in FIG. 5 or 6.

Elementary light-emitting diodes 32 may correspond to discrete components. As a variation, all the elementary light-emitting diodes 32 or some of them may be formed in integrated fashion on a single circuit. The other electronic components of the optoelectronic circuit, particularly, the resistors and the transistors, may be discrete components or may be at least partly formed in integrated fashion.

Elementary light-emitting diodes 32 may be formed on a first circuit which is separate from a second circuit having the other electronic components of the optoelectronic circuit formed thereon. The first circuit is for example, attached to the second circuit by a flip-chip connection.

As a variation, elementary light-emitting diodes 32 may be formed in integrated fashion with the other electronic components of the optoelectronic circuit or part of them.

Elementary light-emitting diodes 32 are for example planar light-emitting diodes or light-emitting diodes formed from three-dimensional elements, particularly semiconductor microwires or nanowires, comprising, for example, a semiconductor material based on a compound mainly comprising a group-III element and a group-V element (for example, gallium nitride GaN), called III-V compound hereafter, or mainly comprising at least one group-II element and one group-VI element (for example zinc oxide ZnO), called II-VI compound hereafter.

The operation of optoelectronic circuit 30 will now be described for an example where voltage $V_{ALIM}$ supplied by rectifying bridge 12 is a rectified sinusoidal voltage comprising a succession of cycles, in each of which voltage $V_{ALIM}$ increases from the zero value, crosses a maximum value, and decreases to the zero value.

At the initial time, at the beginning of a cycle, voltage $V_{ALIM}$ is zero. Current $I_{ALIM}$ is thus also zero and voltages $V_{GSi}$ are equal to 0 V for i varying from 1 to N−1. All transistors $T_i$ then are in the on state. When the voltage across general light-emitting diode $D_N$ increases above the threshold voltage of general light-emitting diode $D_N$, general light-emitting diode $D_N$ becomes conductive. As voltage $V_{ALIM}$ increases, current $I_{ALIM}$, which is set by resistors $R_i$, with i varying from 1 to N, increases. Thereby, each voltage $V_{GSi}$, which is negative, increases in absolute value. However, since resistors $R_i$ have different values, voltages $V_{GSi}$ are different. For i varying from 1 to N−1, each time voltage $V_{GSi}$ becomes smaller, in absolute value, than the threshold voltage of transistor $T_i$, the latter turns off. For i varying from 1 to N−1, transistors $T_i$ turn off at successive times which depend on the values of resistors $R_i$ and on the variation of power supply voltage $V_{ALIM}$. Resistor $R_i$ is further selected so that, when transistor $T_i$ turns off, the voltage applied across general light-emitting diode $D_i$ is greater than the equivalent threshold voltage of general light-emitting diode $D_i$. This equivalent threshold voltage is equal to the sum of the threshold voltages of the series-connected light-emitting diodes forming general light-emitting diode $D_i$. Thus, general light-emitting diode $D_i$ is on after the switching to the off state of the transistor. In a phase of decrease of voltage $V_{ALIM}$, transistors $T_i$ successively switch from the off state to the on state by short-circuiting the associated general light-emitting diodes $D_i$.

According to a variation, each resistor $R_i$, or some of them, may be replaced with an electronic component or an assembly of electronic components having a resistance equivalent to $R_i$. According to an embodiment, each resistor $R_i$ may be formed by a plurality of resistors, possibly of same value, assembled in parallel.

Figure 7:
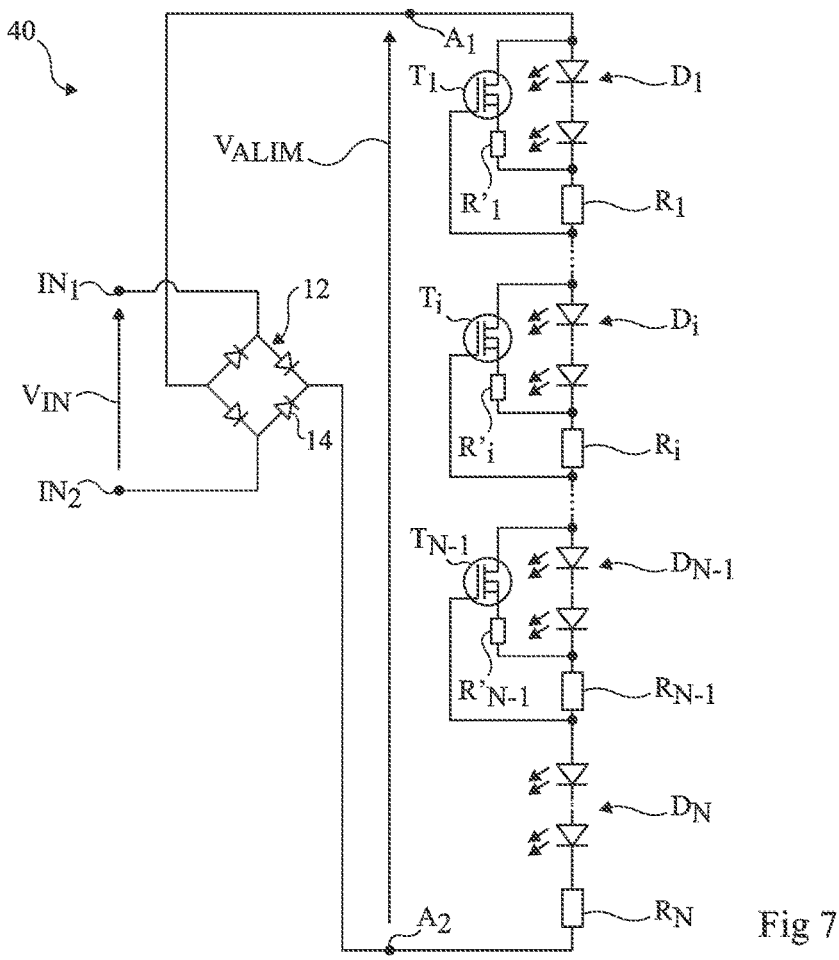
FIG. 7 shows an electric diagram of another embodiment of an optoelectronic circuit comprising light-emitting diodes.

FIG. 7 shows an electric diagram of another embodiment of an optoelectronic circuit 40. Optoelectronic circuit 40 comprises all the elements of optoelectronic circuit 30 and further comprises, for each transistor $T_i$, with i varying from 1 to N−1, a resistor $R'_i$ assembled between the source of transistor $T_i$ and the cathode of general light-emitting diode $D_i$. As a variation, resistor $R'_i$ may be assembled between the drain of transistor $T_i$ and the anode of general light-emitting diode $D_i$.

At a given time, during the variation of voltage $V_{ALIM}$, the equivalent resistance of the conducting resistors of optoelectronic circuit 40 is substantially equal to the sum of all resistors $R_1$ to $R_N$ and of each resistor $R'_i$ series-connected with a transistor $T_i$. Voltage $V_{RES\_EQUIVALENTE}$ across this equivalent resistor is equal to $V_{ALIM}$ decreased by the sum of the voltages across conducting general light-emitting diodes $D_i$. The current flowing through optoelectronic circuit 40 is thus equal to the ratio of voltage $V_{RES\_EQUIVALENTE}$ to the equivalent resistance of the conducting resistors. This means that the equivalent resistance of optoelectronic circuit 40 is maximum when voltage $V_{ALIM}$ is zero, decreases in stages during a phase of increase of voltage $V_{ALIM}$, each time one of transistors $T_i$ switches off, is minimum when voltage $V_{ALIM}$ is maximum and increases in stages during a phase of decrease of voltage $V_{ALIM}$, each time one of transistors $T_i$ turns on. The resulting current is thus minimum when $V_{ALIM}$ is zero, increases in stages, each time one of transistors $T_i$ switches off, is maximum when voltage $V_{ALIM}$ is maximum, and decreases in stages during a phase of decrease of voltage $V_{ALIM}$, each time one of transistors $T_i$ turns on. This advantageously enables to increase the power factor of optoelectronic circuit 40 with respect to optoelectronic circuit 30.

An advantage of the previously-described embodiments is that optoelectronic circuit 30, 40 comprises no control unit capable of controlling the turning on or off of transistors $T_i$. Indeed, the switching between the on and off states of each transistor $T_i$ is automatically performed during the variation of voltage $V_{ALIM}$. The structure of optoelectronic circuit 30, 40 is thus particularly simple. Another advantage is that, since the control of light-emitting diodes is performed by MOS transistors and resistors, the electronic components may advantageously be formed in integrated fashion with the light-emitting diodes.

The previously-described optoelectronic circuits 30 and 40 may be formed by an optoelectronic device comprising planar light-emitting diodes or formed from three-dimensional elements, for example, microwires, nanowires, conical elements, or frustoconical elements. In the following description, embodiments will be described for light-emitting diodes formed from microwires or nanowires. However, these embodiments may be implemented for three-dimensional elements other than microwires or nanowires, for example, pyramidal three-dimensional elements.

Term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

Figure 8A:
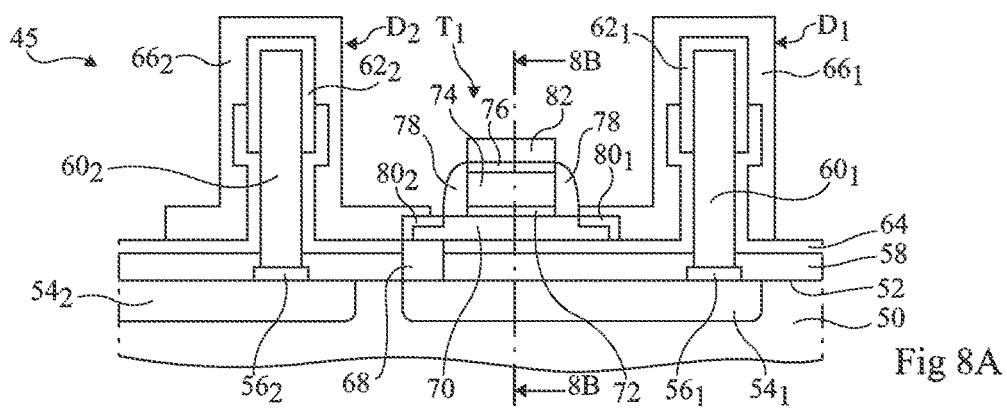
FIGS. 8A and 8B are partial simplified cross-section views of an embodiment of the optoelectronic circuit shown in FIG. 4 or 7 formed in integrated fashion.
Figure 8B:
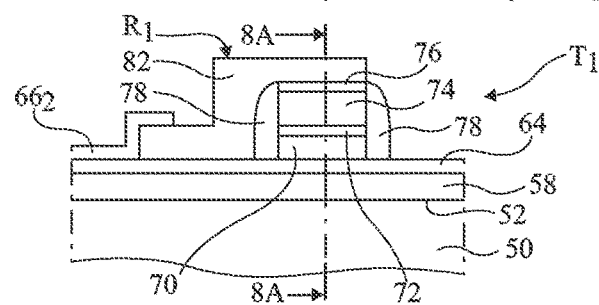

FIGS. 8A and 8B are cross-section views of an embodiment of an optoelectronic device 45 comprising light-emitting diodes and MOS transistors formed in integrated fashion. Optoelectronic device 45 may be used to form the above-described optoelectronic circuits 30 and 40.

In FIGS. 8A and 8B, only general light-emitting diodes $D_1$, $D_2$ have been shown. Further, a single elementary light-emitting diode has been shown as an example for each general light-emitting diode $D_1$, $D_2$.

FIG. 8A shows an optoelectronic device structure 45 comprising:
- a semiconductor substrate 50, non-doped or lightly-doped with a first conductivity type, comprising an upper surface 52, preferably planar at least at the level of the light-emitting diodes;
- semiconductor regions $54_1$, $54_2$ extending in substrate 50 from surface 52, doped with a second conductivity type opposite to the first type, and more heavily doped than substrate 50;
- seed pads $56_1$, $56_2$ favoring the growth of wires and arranged on surface 52, each seed pad $56_1$, $56_2$ being in contact with the underlying doped region $54_1$, $54_2$;
- an insulating layer 58 covering surface 52 and a portion of each seed pad $56_1$, $56_2$;
- wires $60_1$, $60_2$ (two wires being shown as an example), each wire $60_1$, $60_2$ being in contact with one of seed pads $56_1$, $56_2$ through insulating layer 58;
- a shell $62_1$, $62_2$ comprising a stack of semiconductor layers covering an upper portion of each wire $60_1$, $60_2$;
- an insulating layer 64 extending on insulating layer 58 and on the lateral sides of each wire $60_1$, $60_2$ which are not covered with shell $62_1$, $62_2$ and on the lower portion of shell $62_1$, $62_2$;
- a layer $66_1$, $66_2$ forming an electrode covering each shell $62_1$, $62_2$ and further extending on a portion of insulating layer 64;
- a doped semiconductor portion 68 of the second conductivity type extending through insulating layers 58 and 64 in contact with doped semiconductor region $54_1$;
- a doped semiconductor region 70 of the second conductivity type extending on insulating layer 64 and in contact with semiconductor portion 68;
- an insulating portion 72 extending on a portion of semiconductor region 70;
- a semiconductor portion 74 extending on insulating portion 72, possibly covered with a silicide portion 76;
- insulating spacers 78 on either side of semiconductor portion 74, where the portions of semiconductor region 70 which are not covered with spacers 78 and insulating portion 72 may be covered with a silicided portion $80_1$, $80_2$, electrode $66_1$ coming into contact with silicided portion $80_1$ along an edge thereof and electrode $66_2$ coming into contact with silicided portion $80_2$;
- a semiconductor or metal portion 82 in contact with silicided portion 76 and extending on insulating layer 64 and coming into contact with electrode $66_2$ as shown in FIG. 8B.

FIG. 8B is a cross-section view having a cross-section plane perpendicular to the cross-section plane of FIG. 8A. Portion 82 covers one of spacers 78, extends on a portion of insulating layer 64, and comes into contact with electrode $66_2$ in the plane of FIG. 8B. The material and the geometry of portion 82 are adjusted to obtain the value of resistor $R_1$. As an example, the length of portion 82 resting on insulating layer 64 may be increased to obtain a larger resistance value R1. As an example, the thickness of portion 82 may be increased to obtain a smaller resistance value R1. As a variation, portion 82 may cover one of spacers 78 and come into contact with electrode $66_2$ in the plane of FIG. 8A. As a variation, electrode $66_2$ may be confounded with semiconductor portion 82.

A conductive layer, not shown, covering electrode layer $66_1$, $66_2$ between wires $60_1$, $60_2$ but which does not extend on wires $60_1$, $60_2$, may be provided. An encapsulation layer, not shown, covering the entire structure and particularly each electrode layer $66_1$, $66_2$ may be provided. Optoelectronic device 45 may further comprise a layer of phosphors, not shown, confounded with the encapsulation layer or provided on the encapsulation layer.

Wire $60_1$ and the associated shell $62_1$ form an elementary light-emitting diode of general light-emitting diode $D_1$ and wire $60_2$ and the associated shell $62_2$ form an elementary light-emitting diode of general light-emitting diode $D_2$. In the present embodiment, the support supporting the light-emitting diodes comprises substrate 50 and seed pads $56_1$, $56_2$. Semiconductor portion 74 forms the gate of transistor $T_1$. Insulating portion 72 forms the gate insulator of transistor $T_1$. The channel of transistor $T_1$ corresponds to the area of semiconductor region 70 covered with insulating portion 72. The drain and the source of transistor $T_1$ correspond to the lateral areas of semiconductor region 70. Resistor $R_1$ is formed by semiconductor portion 82. As a variation, resistor $R_1$ may be formed by a semiconductor region formed in substrate 50.

In the present embodiment, semiconductor substrate 50 corresponds to a monolithic structure. Semiconductor substrate 50 for example is a substrate made of silicon, of germanium, of silicon carbide, of a III-V compound such as GaN or GaAs, or a ZnO substrate. Preferably, substrate 50 is a single-crystal silicon substrate. Substrate 50 is non-doped or lightly-doped with a dopant concentration smaller than or equal to $5*10^{16}$ atoms/cm$^3$, preferably substantially equal to $10^{15}$ atoms/cm$^3$. Substrate 50 has a thickness in the range from 275 µm to 1.5 mm, preferably 725 µm. In the case of a silicon substrate 50, examples of P-type dopants are boron (B) or indium (In) and examples of N-type dopants are phosphorus (P), arsenic (As), or antimony (Sb). Preferably, substrate 50 is P-type boron-doped.

Seed pads $56_1$, $56_2$, also called seed islands, are made of a material favoring the growth of wires $60_1$, $60_2$. As a variation, seed pads $56_1$, $56_2$ may be replaced with a seed layer covering surface 52 of substrate 50 in the area associated with each light-emitting diode $D_1$, $D_2$. Further, seed pads $56_1$, $56_2$ provide the electric continuity between wires $60_1$, $60_2$ and the underlying doped regions $54_1$, $54_2$. As an example, the material forming seed pads $56_1$, $56_2$ may be a nitride, a carbide, or a boride of a transition metal from column IV, V, or VI of the periodic table of elements or a combination of these compounds. Seed pads $56_1$, $56_2$ may be doped with the same conductivity type as substrate 50.

Seed pads $56_1$, $56_2$ may be obtained by depositing a seed layer on surface 52 and by etching portions of the seed layer all the way to surface 52 of substrate 50 to delimit the seed pads. The seed layer may be deposited by a method such as chemical vapor deposition (CVD) or metal-organic chemical vapor deposition (MOCVD), also known as metal-organic vapor phase epitaxy (MOVPE). However, methods such as molecular beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE), or an atomic layer deposition (ALD), may be used. Further, methods such as evaporation or reactive cathode sputtering may be used.

When seed pads $56_1$, $56_2$ are made of aluminum nitride, they may be substantially textured and have a preferred polarity. The texturing of pads $56_1$, $56_2$ may be obtained by an additional treatment performed after the deposition of the seed layer. It for example is an anneal under an ammonia flow ($NH_3$).

Insulating layers 58, 64 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride ($SiO_xN_y$, where x may be approximately equal to ½ and y may be approximately equal to 1, for example, $Si_2ON_2$), of aluminum oxide ($Al_2O_3$), of hafnium oxide ($HfO_2$), or of diamond. As an example, the thickness of each insulating layer 58, 64 is in the range from 5 nm to 800 nm, for example, equal to approximately 30 nm.

Wires $60_1$, $60_2$ are at least partly formed from at least one semiconductor material. The semiconductor material may be silicon, germanium, silicon carbide, a III-V compound, a II-VI compound, or a combination of these compounds.

Wires $60_1$, $60_2$ may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires $60_1$, $60_2$ may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires $60_1$, $60_2$ may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires $60_1$, $60_2$ may have different shapes, such as, for example, oval, circular, or polygonal, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. The average diameter of each wire $60_1$, $60_2$ may be in the range from 50 nm to 2.5 µm. The height of each wire $60_1$, $60_2$ may be in the range from 250 nm to 50 µm. Each wire $60_1$, $60_2$ may have an elongated semiconductor structure along an axis substantially perpendicular to surface 52. Each wire $60_1$, $60_2$ may have a generally cylindrical shape. The axes of two adjacent wires of a same general light-emitting diode may be distant by from 0.5 µm to 10 µm and preferably from 1.5 µm to 5 µm. As an example, wires $60_1$, $60_2$ may be regularly distributed, particularly in a hexagonal network.

As an example, the lower portion of each wire $60_1$, $60_2$ is mainly formed of the III-N compound, for example, gallium nitride, of same doping type as substrate 50, for example, of type N, for example, silicon-doped. Lower portion $60_1$, $60_2$ extends up to a height which may be in the range from 100 nm to 25 µm.

As an example, the upper portion of each wire $60_1$, $60_2$ is at least partially made of a III-N compound, for example, GaN. The upper portion may be doped with the same conductivity type as the lower portion of wire $60_1$, $60_2$, for example, of type N, and may possibly be less heavily doped than the lower portion or may not be intentionally doped. The upper portion extends up to a height which may be in the range from 100 nm to 25 µm.

Wires $60_1$, $60_2$ may be grown by a method of CVD, MOCVD, MBE, GSMBE, PAMBE, ALE, HVPE, ALD type. Further, electrochemical methods may be used, for example, chemical bath deposition (CBD), hydrothermal methods, liquid-feed flame spray pyrolysis, or electrodeposition.

As an example, the wire growth method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane ($SiH_4$).

The presence of silane among the precursor gases causes the incorporation of silicon within the GaN compound. A lower N-type doped portion of wires $60_1$, $60_2$ is thus obtained. This further translates as the forming of a silicon nitride layer, not shown, which covers the periphery of the portion of wires $60_1$, $60_2$, except for the top, as the lower portion grows.

For the growth of the upper portion, the operating conditions used for the growth of the lower portion are, as an example, maintained, but for the fact that the flow of the precursor of the additional element, for example, silane, is decreased or stopped. Even when the silane flow is stopped, the upper portion of wires $60_1$, $60_2$ may be N-type doped due to the diffusion in this active portion of dopants originating from the adjacent passivated portions or due to the residual doping of GaN.

Shell $62_1$, $62_2$ may comprise a stack of a plurality of layers, particularly comprising:

an active layer covering the upper portion of the associated wire $60_1$, $60_2$;

an intermediate layer having a conductivity type opposite to that of the lower portion of wire $60_1$, $60_2$ and covering the active layer; and a bonding layer covering the intermediate layer and covered with electrode $66_1$, $66_2$.

The active layer is the layer from which most of the radiation delivered by the elementary light-emitting diode is emitted. According to an example, the active layer may comprise confinement means, such as multiple quantum wells. It is for example formed of an alternation of GaN and InGaN layers having respective thicknesses from 5 to 20 nm (for example, 8 nm) and from 1 to 10 nm (for example, 2.5 nm). The GaN layers may for example be N-type or P-type doped. According to another example, the active layer may comprise a single InGaN layer, for example having a thickness greater than 10 nm.

The intermediate layer, for example, P-type doped, may correspond to a semiconductor layer or to a stack of semiconductor layers and allows the forming of a P—N or P—I—N junction, the active layer being located between the intermediate P-type layer and the upper N-type portion of wire $60_1$, $60_2$ of the P—N or P—I—N junction.

The bonding layer may correspond to a semiconductor layer or to a stack of semiconductor layers and enables to form an ohmic contact between the intermediate layer and electrode $66_1$, $66_2$. As an example, the bonding layer may be very heavily doped, of a type opposite to that of the lower portion of each wire $60_1$, $60_2$, to degenerate the semiconductor layer(s), for example, P-type doped at a concentration greater than or equal to $10^{20}$ atoms/cm$^3$.

The stack of semiconductor layers may comprise an electron barrier layer formed of a ternary alloy, for example, aluminum gallium nitride (AlGaN) or aluminum indium nitride (AlInN) in contact with the active layer and the intermediate layer, to provide a good distribution of electric carriers in the active layer.

Electrode $66_1$, $66_2$ is capable of biasing the active layer of each wire $60_1$, $60_2$ and of letting through the electromagnetic radiation emitted by the light-emitting diodes. The material forming electrode $66_1$, $66_2$ may be a transparent conductive material such as indium tin oxide (ITO), aluminum zinc oxide, or graphene. As an example, electrode layer $66_1$, $66_2$ has a thickness in the range from 5 nm to 200 nm, preferably from 20 nm to 50 nm.

The encapsulation layer may be made of an at least partially transparent insulating material. The minimum thickness of the encapsulation layer is in the range from 250 nm to 50 µm so that the encapsulation layer fully covers electrode $66_1$, $66_2$ at the top of the sets of light-emitting diodes $D_1$, $D_2$. The encapsulation layer may be made of an at least partially transparent inorganic material. As an example, the inorganic material is selected from the group comprising silicon oxides of $SiO_x$ type, where x is a real number between 1 and 2, or $SiO_yN_z$ type, where y and z are real numbers between 0 and 2, and aluminum oxides, for example, $Al_2O_3$. The encapsulation layer may be made of an at least partially transparent organic material. As an example, the encapsulation layer is a silicone polymer, an epoxide polymer, an acrylic polymer, or a polycarbonate.

Semiconductor portion 68 may be made of the same materials as substrate 50. It may be formed by epitaxy or by deposition after opening of insulating layers 58 and 64.

Semiconductor region 70 may be made of the same materials as substrate 50. Semiconductor region 70 may have a thickness in the range from 10 nm to 500 nm. Semiconductor region 70 may be formed by deposition and then shaped by etching after a photolithography step.

Insulating portion 72 may be made of silicon oxide of $SiO_x$ type, where x is a real number in the range from 1 to 2, or $SiO_yN_z$ type, where y and z are real numbers in the range from 0 to 2, of hafnium oxide $HfO_2$, of lanthanum oxide $La_2O_3$, of zirconium oxide $ZrO_2$, of tantalum oxide $Ta_2O_3$, or of a compound of the previous materials. Insulating portion 72 may have a thickness in the range from 1 nm to 25 nm. Insulating portion 72 may be formed by deposition or by oxidation of semiconductor region 70.

Semiconductor portion 74 may be made of polysilicon, of titanium nitride (TiN), of tungsten (W), of tantalum nitride (TaN), of tantalum (Ta), or of platinum (Pt), or of a multilayer of these materials. Semiconductor portion 74 may have a thickness in the range from 10 nm to 200 nm. Semiconductor portion 74 may be formed by CVD, by physical vapor deposition (PVD), or by plasma-enhanced CVD (PECVD).

Semiconductor or metal portion 82 may be made of polysilicon, tungsten, copper, nickel, molybdenum, silver, gold, palladium, platinum, or an alloy, for example, of iron-nickel (FeNi) or of iron-nickel-cobalt (FeNiCo). Semiconductor or metal portion 82 may have a thickness in the range from 10 nm to 150 nm. Semiconductor portion 82 may be formed by deposition and then patterned by photolithography and etch steps.

Figure 9A:
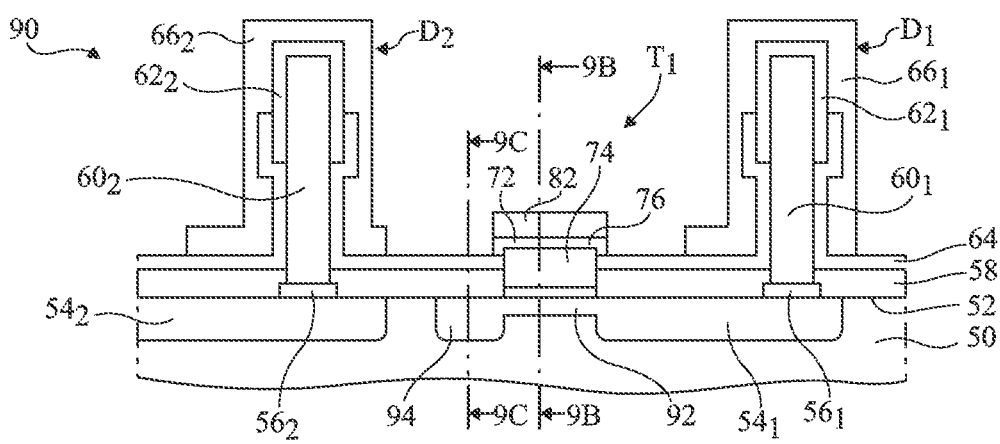
FIGS. 9A to 9C are partial simplified cross-section views of another embodiment of the optoelectronic circuit shown in FIG. 4 or 7 formed in integrated fashion.
Figure 9B:
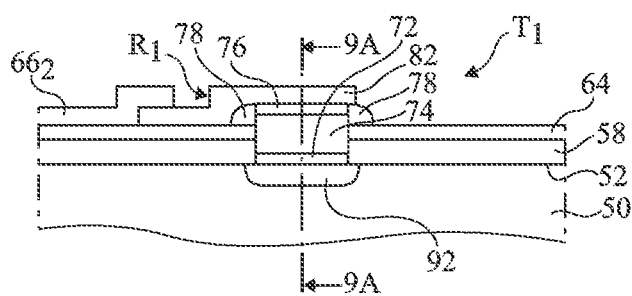
Figure 9C:
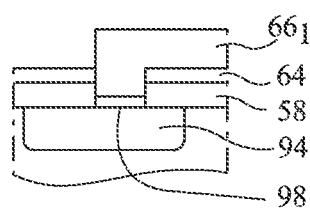

FIGS. 9A, 9B, and 9C are cross-section views of another embodiment of an optoelectronic device 90. The elements common with optoelectronic device 45 shown in FIGS. 8A and 8B are designated with the same reference numerals. Optoelectronic device 90 comprises additional doped semiconductor regions 92, 94 of the same conductivity type as region $54_1$, which extend into substrate 50 from surface 52. Semiconductor region 92 forms the channel of transistor $T_1$ and the drain and the source of transistor $T_1$ are formed in semiconductor regions $54_1$ and 94. Insulating portion 72, forming the gate insulator of transistor $T_1$, rests on doped semiconductor region 92. Electrode $66_1$ is in electric contact with semiconductor region 94 through insulating layers 58, 64, possibly via a silicided portion 98.

FIG. 9B is a cross-section view having a cross-section plane perpendicular to the cross-section plane of FIG. 9A. Portion 82 covers one of spacers 78 and may come into contact with electrode $66_2$ in the plane of FIG. 9B. As a variation, portion 82 may come into contact with electrode $66_2$ in the plane of FIG. 9A. As a variation, electrode $66_2$ may be confounded with semiconductor portion 82.

Various embodiments with different variations have been described hereabove. It should be noted that those skilled in the art may combine various elements of these various embodiments and variations without showing any inventive step.

The invention claimed is:

1. An optoelectronic circuit intended to receive a variable voltage containing an alternation of increase and decrease phases, the optoelectronic circuit comprising:

an alternation of resistive elements and of sets of series-assembled light-emitting diodes, each set comprising two terminals, each resistive element being interposed between two successive sets, the resistive elements and the sets of series-assembled light-emitting diodes being mounted in series;

for each set from among a plurality of said sets, a depletion metal-oxide gate field effect transistor having its drain and its source coupled to the terminals of said set and having its gate coupled to one of the terminals of the next set, an additional resistive element being, for at least some of the transistors, coupled between the drain or the source of the transistor and one of the terminals of said set.

2. The optoelectronic circuit of claim 1, comprising N sets, where N is an integer in the range from 2 to 200, and comprising for each of the N−1 sets, a depletion metal-oxide gate field effect transistor having its drain and its source coupled to the terminals of said set and having its gate coupled to one of the terminals of the next set.

3. The optoelectronic circuit of claim 1, wherein at least some of the resistive elements have different resistance values.

4. The optoelectronic circuit of claim 1, where each resistive element comprises at least one electric resistor.

5. The optoelectronic circuit of claim 1, further comprising a fullwave rectifying circuit capable of supplying said voltage (VALIM).

6. The optoelectronic circuit of claim 1, comprising an integrated circuit comprising the sets of light-emitting diodes, the resistive elements, and the transistors.

7. The optoelectronic circuit of claim 1, wherein each light-emitting diode is a planar diode.

8. The optoelectronic circuit of claim 1, comprising an integrated circuit comprising a support, the sets of light-emitting diodes resting on the support, each light-emitting diode comprising at least one wire-shaped, conical, or frustoconical semiconductor element.

9. The optoelectronic circuit of claim 8, further comprising at least one insulating layer at least partially covering the support and, for each transistor, a semiconductor portion extending on the insulating layer and forming the source, the drain of the transistor, and the channel of the transistor, an insulating portion covering the semiconductor portion on the side opposite to the insulating layer and forming the gate insulator of the transistor.

10. The optoelectronic circuit of claim 8, wherein the support comprises a non-doped or doped semiconductor substrate of a first conductivity type, the optoelectronic circuit comprising, for each transistor, doped semiconductor regions of a second conductivity type, more heavily doped than the substrate, extending into the substrate and forming the source, the drain, and the channel of the transistor and an insulating portion extending on the substrate and forming the gate insulator of the transistor.

11. An optoelectronic circuit intended to receive a variable voltage containing an alternation of increase and decrease phases, the optoelectronic circuit comprising:

an alternation of resistive elements and of sets of series-assembled light-emitting diodes, each set comprising two terminals, each resistive element being interposed between two successive sets;

for each set from among a plurality of said sets, a depletion metal-oxide gate field effect transistor having its drain and its source coupled to the terminals of said set and having its gate coupled to one of the terminals of the next set, an additional resistive element being, for at least some of the transistors, coupled between the drain or the source of the transistor and one of the terminals of said set.

12. The optoelectronic circuit of claim 11, comprising N sets, where N is an integer in the range from 2 to 200, and comprising for each of the N−1 sets, a depletion metal-oxide gate field effect transistor having its drain and its source coupled to the terminals of said set and having its gate coupled to one of the terminals of the next set.

13. The optoelectronic circuit of claim 11, wherein at least some of the resistive elements have different resistance values.

14. The optoelectronic circuit of claim 11, where each resistive element comprises at least one electric resistor.

15. The optoelectronic circuit of claim 11, further comprising a fullwave rectifying circuit capable of supplying said voltage (VALIM).

16. The optoelectronic circuit of claim 11, comprising an integrated circuit comprising the sets of light-emitting diodes, the resistive elements, and the transistors.

17. The optoelectronic circuit of claim 11, wherein each light-emitting diode is a planar diode.

18. The optoelectronic circuit of claim 11, comprising an integrated circuit comprising a support, the sets of light-emitting diodes resting on the support, each light-emitting diode comprising at least one wire-shaped, conical, or frustoconical semiconductor element.

19. The optoelectronic circuit of claim 18, further comprising at least one insulating layer at least partially covering the support and, for each transistor, a semiconductor portion extending on the insulating layer and forming the source, the drain of the transistor, and the channel of the transistor, an insulating portion covering the semiconductor portion on the side opposite to the insulating layer and forming the gate insulator of the transistor.

20. The optoelectronic circuit of claim 18, wherein the support comprises a non-doped or doped semiconductor substrate of a first conductivity type, the optoelectronic circuit comprising, for each transistor, doped semiconductor regions of a second conductivity type, more heavily doped than the substrate, extending into the substrate and forming the source, the drain, and the channel of the transistor and an insulating portion extending on the substrate and forming the gate insulator of the transistor.

* * * * *